(12) United States Patent
Arfsten et al.

(10) Patent No.: US 9,550,161 B2
(45) Date of Patent: Jan. 24, 2017

(54) COMPOSITION AND PROCESS FOR MAKING A POROUS INORGANIC OXIDE COATING

(71) Applicant: DSM IP ASSETS B.V., Heerlen (NL)

(72) Inventors: Nanning Joerg Arfsten, Echt (NL); Roberto Arnoldus Dominicus Maria Habets, Echt (NL); Michael Alphonsus Cornelis Johannes Van Dijck, Echt (NL)

(73) Assignee: DSM IP ASSETS B.V., Heerlen (NL)

( * ) Notice: Subject to any disclaimer, the term of this patent is extended or adjusted under 35 U.S.C. 154(b) by 0 days.

(21) Appl. No.: 14/402,950

(22) PCT Filed: May 17, 2013

(86) PCT No.: PCT/EP2013/060276
§ 371 (c)(1),
(2) Date: Nov. 21, 2014

(87) PCT Pub. No.: WO2013/174754
PCT Pub. Date: Nov. 28, 2013

(65) Prior Publication Data
US 2015/0132564 A1 May 14, 2015

(30) Foreign Application Priority Data

May 22, 2012 (EP) ..................... 12168870
May 22, 2012 (EP) ..................... 12168873

(51) Int. Cl.
| | | |
|---|---|---|
| C09D 5/00 | (2006.01) | |
| B05D 5/06 | (2006.01) | |
| B05D 3/02 | (2006.01) | |
| B01J 13/12 | (2006.01) | |
| B01J 13/18 | (2006.01) | |
| C03C 17/00 | (2006.01) | |
| G02B 1/11 | (2015.01) | |
| H01L 31/0216 | (2014.01) | |
| H01L 31/0232 | (2014.01) | |
| H01L 31/0236 | (2006.01) | |
| C01G 23/047 | (2006.01) | |
| C01G 25/02 | (2006.01) | |
| C08J 3/12 | (2006.01) | |
| C09D 7/12 | (2006.01) | |
| C01B 33/143 | (2006.01) | |
| C01B 33/145 | (2006.01) | |
| C01B 33/149 | (2006.01) | |
| G02B 1/111 | (2015.01) | |

(52) U.S. Cl.
CPC .............. *B01J 13/125* (2013.01); *B01J 13/18* (2013.01); *B05D 3/0254* (2013.01); *B05D 5/061* (2013.01); *C01B 33/143* (2013.01); *C01B 33/145* (2013.01); *C01B 33/149* (2013.01); *C01G 23/047* (2013.01); *C01G 25/02* (2013.01); *C03C 17/007* (2013.01); *C08J 3/128* (2013.01); *C09D 5/006* (2013.01); *C09D 7/1266* (2013.01); *C09D 7/1291* (2013.01); *G02B 1/11* (2013.01); *G02B 1/111* (2013.01); *H01L 31/02168* (2013.01); *H01L 31/02325* (2013.01); *H01L 31/02366* (2013.01); *C01P 2004/34* (2013.01); *C01P 2004/64* (2013.01); *C03C 2217/425* (2013.01); *C03C 2217/732* (2013.01); *Y02E 10/50* (2013.01); *Y10T 428/24997* (2015.04)

(58) Field of Classification Search
CPC ........ C09D 5/006; B05D 3/0254; B05D 5/061
See application file for complete search history.

(56) References Cited

U.S. PATENT DOCUMENTS

| | | | |
|---|---|---|---|
| 2002/0064541 A1 | 5/2002 | Lapidot et al. | |
| 2009/0220774 A1 | 9/2009 | Imai et al. | |
| 2011/0250626 A1* | 10/2011 | Williams | ............... A01N 63/02 |
| | | | 435/18 |
| 2013/0202895 A1* | 8/2013 | Arfsten | ................. C03C 17/007 |
| | | | 428/446 |
| 2013/0330386 A1* | 12/2013 | Whitten | ............... C08F 230/08 |
| | | | 424/409 |

FOREIGN PATENT DOCUMENTS

| | | |
|---|---|---|
| WO | WO 01/80823 | 11/2001 |
| WO | WO 2005/103175 | 11/2005 |
| WO | WO 2008/143429 | 11/2008 |
| WO | WO 2009/140482 | 11/2009 |
| WO | WO 2011157820 A1 * | 12/2011 ........... C03C 17/007 |

OTHER PUBLICATIONS

International Search Report for PCT/EP2013/060276 mailed Jan. 10, 2014.

\* cited by examiner

*Primary Examiner* — Robert Harlan
(74) *Attorney, Agent, or Firm* — Nixon & Vanderhye P.C.

(57) ABSTRACT

The invention relates to a coating composition for making a porous inorganic oxide coating layer on a substrate, the composition comprising an inorganic oxide precursor as binder, a solvent, and a synthetic polyampholyte as pore forming agent. The size of the pores in the coating can be advantageously controlled by the comonomer composition of the polyampholyte, and/or by selecting conditions like temperature, pH, salt concentration, and solvent composition when making the composition. The invention also relates to a method of making such coating composition, to a process of applying a coating on a substrate using such composition, and to such coated substrate showing a specific combination of optical and mechanical properties.

17 Claims, 3 Drawing Sheets

COMPOSITION AND PROCESS FOR MAKING A POROUS INORGANIC OXIDE COATING

This application is the U.S. national phase of International Application No. PCT/EP2013/060276 filed 17 May 2013, which designated the U.S. and claims priority to EP 12168873.3 filed 22 May 2012, and EP 12168870.9 filed 22 May 2012, the entire contents of each of which are hereby incorporated by reference.

FIELD

The invention relates to a coating composition for making a porous inorganic oxide coating on a substrate, more specifically to such coating composition for use in a process of applying an anti-reflective (AR) coating on a transparent substrate, the composition comprising an inorganic oxide precursor as binder, a solvent, and an organic polymer as pore forming agent.

The invention also relates to a method of making such coating composition, to a process of applying a coating on a substrate using such composition, and to such coated substrate showing a specific combination of optical and mechanical properties.

BACKGROUND AND SUMMARY

A porous inorganic oxide coating is considered to be a relatively thin coating layer—for example of less than 1 micron thickness—which substantially consists of an inorganic oxide and has certain porosity. Such coatings, like those based on silica, can be used for different purposes, and are increasingly applied to a transparent substrate to reduce the amount of light being reflected from the air-substrate interface, and thus increase the amount of light being transmitted through the substrate. Such coatings can be used as single layer or as part of a multi-layer coating (or coating stack). Typical single layer AR coatings based on thin porous silica layers have been described in e.g. EP0597490, U.S. Pat. Nos. 4,830,879, 5,858,462, EP1181256, WO2007/093339, WO2008/028640, EP1674891, WO2009/030703, WO2009/140482, US2009/0220774, and WO2008/143429.

A single layer AR coating on a transparent substrate typically should have a refractive index between the refractive indices of the substrate and air, in order to reduce the amount of light reflected. For example, in case of a glass with refractive index 1.5 the AR layer typically should have a refractive index of about 1.2-1.3, and ideally of about 1.22. A porous silica (or other inorganic oxide) layer having sufficiently high porosity can provide such a low refractive index and function as AR coating, if its layer thickness is about ¼ of the wavelength of the light; meaning that in the relevant wavelength range of 300-800 nm the thickness preferably is in the range 70-200 nm. This of course means that the size and geometry of pores in such coating should be compatible with said layer thickness.

Such porous inorganic oxide coatings are typically made from a solvent based coating composition comprising inorganic oxide precursors and a pore forming agent. Typically a sol-gel process, also known as chemical solution deposition, is used for making such a (porous) inorganic oxide layer starting from a precursor compound in solution or colloid (or sol) form, for forming an integrated network (or gel) of either discrete particles or network polymers. In such process, the sol gradually evolves to a gel-like diphasic system containing both a liquid and solid phase. Removing remaining liquid (drying) is generally accompanied by shrinkage and densification, and affects final microstructure and porosity. Afterwards, a thermal treatment at elevated temperature is often applied to enhance further condensation reactions (curing) and secure mechanical and structural stability. Typical inorganic oxide precursors are metal alkoxides and metal salts, which can undergo various forms of hydrolysis and condensation reactions. Metal is understood to include silicon within the context of this description.

Such coating composition contains solvent and organic ligands from organo-metallic precursors, which compounds as such will induce some porosity to the inorganic oxide layer. The further presence of a pore forming agent in the coating composition helps in generating suitable porosity in the final AR layer to provide the desired refractive index. Suitable pore forming agents, also called porogens, known from prior art publications include organic compounds, like higher boiling solvents, surfactants and organic polymers, and inorganic particles having sub-micron particle size, i.e. inorganic nano-particles.

Organic compounds and polymers as pore forming agent in such coating compositions may in initial stages after applying the coating to a substrate be present in dissolved, dispersed or other form. After drying the coating, these organics can be removed by known methods; for example by exposing the coating to a solvent for the compound or polymer and extracting it from the coating. Alternatively a compound or polymer can be removed during thermally curing the coating by evaporation, for example at temperatures above the boiling point, or above the decomposition temperature of an organic polymer (i.e. by pyrolysis or calcination). Suitable temperatures are from about 250 to 900° C. A combined treatment of dissolving and degrading/evaporating the compound or polymer may also be applied.

Suitable polymers as pore forming agent can be removed from the coating, and provide a desired pore size of below 200 nm. Examples include organic polymers derived from a.o. styrenic, acrylic and olefinic monomers, including homopolymers and copolymers. In U.S. Pat. No. 4,446,171 use of various organic polymers is described, including PMMA, nitrocellulose, cellulose acetate butyrate, polyvinyl alcohol, and a hydroxyl-functional acrylic copolymer. Polyvinyl acetate is applied in U.S. Pat. No. 5,858,462. In EP0835849, EP1181256 and US20080241373 polyethylene oxide is used as porogen.

Inorganic nano-particles are also used to induce porosity in the coated layer; pores in this case resulting from spaces between non-ideally packed agglomerated particles not being completely filled by the inorganic oxide matrix or binder, as in a.o. U.S. Pat. No. 2,432,484, EP1430001 and WO2009/14082. In this last publication a coating solution containing silica nanoparticles of primary particle size 40 nm, an acid having pKa≤3.5, and optionally a coupling agent like tetraethylorthosilicate (TEOS) is used to make a uniform AR coating layer.

Porous, hollow, and core-shell inorganic nano-particles represent a special group of inorganic particles. In US2009/0220774 an AR coating composed of mesoporous silica nano-particles is described, which coating typically comprises pores of diameter 2-10 nm within the mesoporous particles, and pores of diameter 5-200 nm between said particles. The mesoporous silica particles of diameter of 200 nm or less preferably have a porous structure with hexagonally arranged mesopores, and are made with a combination of a cationic and a nonionic surfactant.

WO2008/143429 describes a method of making an AR coating, wherein porous silica particles having particles size of 10-100 nm are produced by a) mixing organic solvent, surfactant and colloidal silica of size 2-50 nm to form silica reversed micelles, b) surface treating the reversed micelles with a silane derivative, and c) removing solvent and surfactant. As surfactant preferably anionic or nonionic surfactants are used. Core-shell inorganic-organic nano-particles are particles with a metal oxide shell and an organic core, which core can be removed—similarly to the organic polymer during curing of a coating as described above—to result in porous or hollow particles embedded in the binder. The organic core can be an organic polymer, like those described above. Such core-shell particles have been described in numerous publications, including U.S. Pat. Nos. 5,100,471, 6,685,966, WO2008028640, WO2008028641, and WO2009030703, and documents cited therein.

Optimum pore size in an AR coating is not only depending on the coating layer thickness as mentioned above, but also on other desired performance characteristics. For example, pore size should not be too large, to minimise light scattering and optimise transparency. On the other hand, if the layer contains very small pores, this may result—under ambient conditions—in non-reversible moisture up-take via capillary condensation; affecting refractive index and making the coating layer more prone to fouling with other components. Such capillary condensation effects have been reported for so-called meso-porous silica, especially having pores in the range 1-20 nm. Too large pores may also deteriorate mechanical strength of the coating, e.g. reduced (pencil) hardness and abrasion resistance. Ideally, pore size can be controlled and selected within a 10-200 nm range to optimize various properties of the AR coating, which is difficult to obtain with prior art systems.

There thus remains a need in industry for a coating composition for making an anti-reflective coating based on a porous inorganic oxide, which provides improved control of pore size and structure, as a tool to improve coating performance in use.

It is therefore an objective of the present invention to provide such an improved coating composition.

The solution to above problem is achieved by providing the coating composition as described herein below and as characterized in the claims. Accordingly, the present invention provides a coating composition for making a porous inorganic oxide coating layer on a substrate, the composition comprising an inorganic oxide precursor as binder, a solvent, and an organic polymer as pore forming agent, wherein the organic polymer comprises a synthetic polyampholyte.

DETAILED DESCRIPTION

Figure 1:
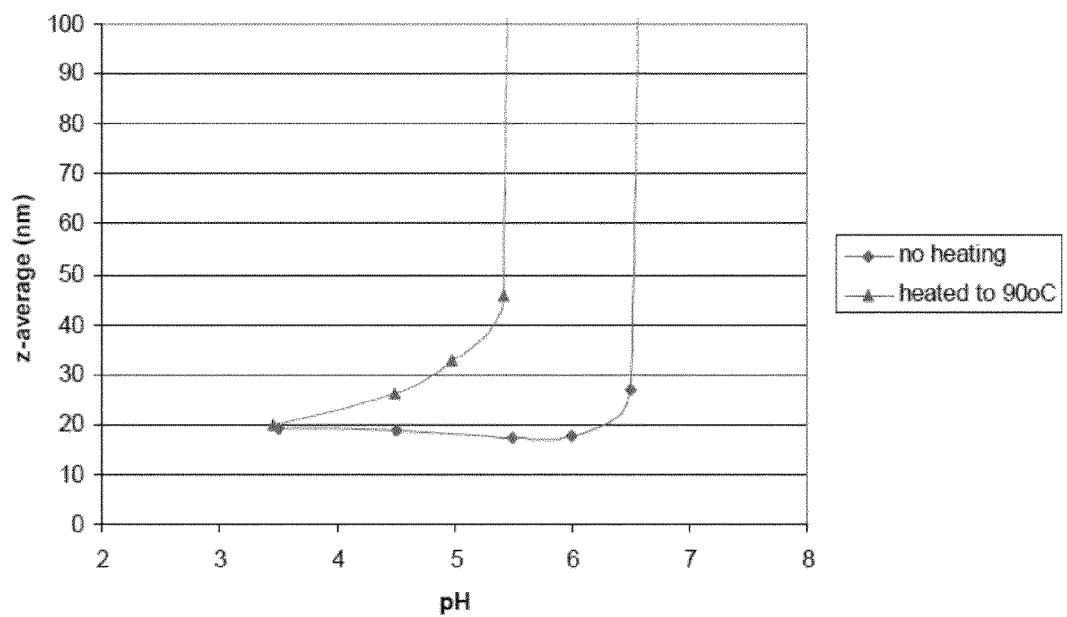
FIG. 1 is a graph of z-average (nm) versus pH for the particles produced in Example 2 below.

Within the context of the present application a synthetic polyampholyte is defined as an ampholytic or amphoteric copolymer, i.e. a synthetic (or man-made) copolymer or polyelectrolyte obtained from at least one comonomer having a positively charged group, at least one comonomer having a negatively charged group, and optionally a neutral comonomer. The polyampholyte thus comprises opposite charges on different monomers or pending groups. A copolymer comprising different charges on the same pending group represents a special type generally referred to as a zwitterionic polymer.

A comonomer having a positively or negatively charged group is understood to include a comonomer having a functional group that can be easily ionised, like carboxylic acid groups or tertiary amine groups by changing pH of the solvent system. Stated otherwise, a polyampholyte is a copolymer or polyelectrolyte containing both cationic and anionic groups, and/or their corresponding ionisable groups, and having a net charge under the conditions applied. Some authors define polyampholytes as charged polymers carrying both basic and acidic groups. The polyampholyte can have a positive or a negative net charge, depending on molecular composition and conditions; which charge can for example be determined by measuring its zeta-potential (in solution/dispersion). A copolymer with a positive net charge will be called a cationic polyampholyte; negatively net charged copolymers will be referred to as being anionic polyampholytes.

The coating composition of the invention comprises a synthetic polyampholyte, preferably in the form of colloidal particles or aggregates having an average particle size in the range of 10 to 200 nm; which size can be advantageously controlled by the comonomer composition of the polyampholyte, and/or by selecting conditions like temperature, pH, salt concentration, and solvent composition when making the composition. Selecting and varying conditions to set particle dimensions enables one to make dispersions of colloidal organic particles with different particle size starting from one polyampholyte; which size affects the pore sizes of a cured coating layer obtained from the composition.

A further advantage of the present invention is that the coating composition is very stable under different conditions; increasing its shelf life or storage time, and allowing for example altering its concentration and solvent system, making the composition suitable for various different application requirements.

Still a further advantage of the present coating composition is that a porous coating can be made via different routes, including selectively dissolving or thermally removing organics from the coating. A further specific advantage of the coating composition of the invention is that a coating with AR properties may be formed on a substrate during thermal treatment at relatively low temperatures compatible with plastic substrates, as well as at high curing temperature compatible with glass processing.

The coating composition according to the invention comprises as binder at least one inorganic oxide precursor. The binder functions as film former or matrix of the coating layer to be made from the composition; and thus mainly determines mechanical and chemical properties of the coating formed, and its adhesion to the substrate. Forming inorganic oxide from a precursor is preferably also possible at elevated temperature, allowing simultaneous curing of binder and removal of organic polymer by heating at temperatures of about 250-900° C.

Suitable inorganic oxide precursors in the coating composition of the invention are those inorganic compounds that can react via hydrolysis and/or condensation reactions to form the corresponding oxide, as are well known in the art of sol-gel chemistry. Examples include compounds like metal alkoxides, metal chelates and metal salts, preferably from metals like Si, Al, Bi, B, In, Ge, Hf, La and lanthanoids, Sb, Sn, Ti, Ta, Nb, Y, Zn and Zr, and mixtures thereof. Preferably, the metal is at least one element selected from Si, Al, Ti, and Zr. The inorganic oxide precursor can be a metal salt or chelate, or an organo-metallic compound, like an alkoxy, an aryloxy, a halogenide, a nitrate, or a sulphate compound, and combinations thereof. Preferred precursors include alkoxy silanes, including halogenated derivates, like tetramethoxy silane (TMOS), tetraethoxy silane (TEOS), methyltrimethoxy silane, methyltriethoxy silane, titanium tetraisopropoxide, aluminium nitrate, aluminium butoxide, yttrium nitrate and zirconium butoxide. More preferably, the precursor comprises TMOS and/or TEOS.

Within the context of this invention, the inorganic oxide precursor can also be a mixture of inorganic oxide precursor compound and (corresponding) inorganic oxide. Such mixture may for example result in case a precursor compound has been partially pre-reacted or pre-hydrolysed to form oligomeric species, typically in the form of nano-sized particles of about 1-20 nm; which is a well-known procedure in sol-gel technology.

In a preferred embodiment, the binder in the coating composition of the invention comprises a mixture of different inorganic oxide precursors, in which case typically a mixed inorganic oxide is formed, as is known for e.g. different glasses. In such mixed oxide the elements are connected via oxygen atoms to form part of an ionic or covalent network, rather than that they are present as a physical mixture of different oxides. Within the context of the present disclosure, mixed inorganic oxide refers to such definition. Formation of a mixed oxide may e.g. be determined by assessing changes in iso-electric point of oxides—e.g in the form of thin layers—formed from different compositions, or by analytical techniques, like IR and solid-state NMR. Nevertheless, it is customary in the art to define the composition of such mixed inorganic oxide by the theoretical amounts of inorganic oxide for each metal presents; e.g. the composition of an aluminosilicate made from Si- and Al-oxide precursors is typically expressed in silica and alumina contents. In case of a mixed oxide as binder, a main metal element is preferably selected from Si, Al, Ti, and Zr, and a second element selected from Si, Al, Be, Bi, B, Fe, Mg, Na, K, In, Ge, Hf, La and lanthanoids, Sb, Sn, Ti, Ta, Nb, Y, Zn and Zr; with a molar ratio of main to second element of about 75:25 to 99:1.

Preferably, the binder in the coating composition comprises a mixture of a silica precursor and a precursor for Al-oxide or Y-oxide, as the mixed oxide formed shows high outdoor resistance or durability.

The coating composition according to the invention comprises at least one solvent. With solvent is meant a liquid component that contains the other coating components in dissolved, or dispersed or colloidal states, and could thus also be referred to as diluent. The at least one solvent in the coating composition of the invention typically comprises water. Water serves as solvent or diluent for the composition, but may also react with the inorganic oxide precursor; for example with an alkoxy silane. The amount of water present in the composition is therefore preferably at least the amount needed for such desired reaction(s), like (partial) hydrolysis of for example tetraethoxy silane. In case complete hydrolysis of TEOS would be aimed at, the composition should contain water in at least a 4:1 molar ratio to Si. Depending on the nature of the binder and other components that can be optionally present, various other solvents can be used in the composition of the invention, including non-protic and protic organic solvents, like ketones, esters, ethers, alcohols, glycols, and mixtures thereof. Suitable other solvents are miscible with water or can at least dissolve a certain amount of water. Examples include 1,4-dioxane, acetone, diethylacetate, propanol, ethanol, methanol, butanol, methyl ethyl ketone, methyl propyl ketone, and tetrahydrofuran. Preferably, the solvent comprises water and an organic solvent miscible with or dissolvable in water. More preferably, the solvent comprises a lower (C1-C8) aliphatic alcohol, like methanol, ethanol, iso-propanol or 1-methoxypropan-2-ol; more preferably the solvent comprises ethanol or iso-propanol, and (a certain amount of) water.

The amount of solvent can be varied to obtain a desired viscosity of the coating composition, which viscosity may be relatively low to allow easy application to a substrate in thin films, e.g. for use as optical coating. Typically the viscosity of the coating composition is at least about 0.6 mPa·s, preferably at least 1.0 or 2.0 mPa·s. The viscosity may as high as 1000 mPa·s for other applications and depending on the application or deposition method. Preferably viscosity is at most 500, 300 or 200 mPa·s. for making thin layers of homogeneous thickness. The viscosity can be measured with known methods, for example with an Ubbelohde PSL ASTM IP no 1 (type 27042) especially for low viscosity ranges, or with a Brookfield viscosimeter.

In the coating composition according to the invention the synthetic polyampholyte is a copolymer, comprising at least one monomer unit having a cationic charge, at least one monomer unit having an anionic charge, and optionally at least one neutral comonomer. The polymer may be a random, but also a block copolymer. The polyampholyte can be a condensation polymer, like a polyester, polyamide, polyurethane and the like; or an addition polymer, comprising styrenic, acrylic, methacrylic, olefinic, and/or vinylic comonomers. Within the context of this application all these monomers are together referred to as ethylenically unsaturated monomers or vinyl monomers; that is including methacrylates which comprise a methyl-vinyl group. Acrylic and methacrylic compounds are together typically referred to as (meth)acrylic monomers in the art. Preferably, the polyampholyte used in the composition according to the invention is an addition polymer, which can advantageously be made using various known polymerisation techniques from a great number of suitable monomers; offering a wide range of compositions for the polyampholyte.

Such ampholytic addition copolymers and their preparation are known from prior art, e.g from U.S. Pat. No. 4,749,762 and a number of documents cited therein. More specifically, U.S. Pat. No. 4,749,762 describes two alternative routes for making polyampholytes from (meth)acrylic monomers. In a one process acrylic acid, N,N,-dimethylaminoethyl methacrylate (DMAEMA) or N,N,-diethylaminoethyl methacrylate (DEAEMA), and optionally an alkyl (meth)acrylate are polymerised in solution in the presence of a strong acid, during which the amine groups are protonated. Alternatively, such mixture of comonomers—but comprising the methyl ester of acrylic acid—is (emulsion) polymerised, followed by selectively hydrolysing the acrylate ester comonomer (which is much faster than hydrolysis of methacrylate esters).

Synthesis of polyampholytes from various ethylenically unsaturated monomers is also described in U.S. Pat. No. 6,361,768 and references cited therein. Typically a radical polymerisation is performed in an organic solvent, and optionally surfactants are present to prevent agglomeration of copolymer formed.

In EP2178927 a dispersion of a cationic ampholytic copolymer is made by first copolymerising a mixture of monomers, for example methyl methacrylate (MMA), DMAEMA and methacrylic acid (MAA), in bulk or solution; followed by dispersing the copolymer obtained in an aqueous medium (and neutralising non-ionic functional groups before or during dispersion).

The coating composition according to the invention preferably comprises as polyampholyte a copolymer obtained from
- at least one cationic or basic monomer (M1), including compounds with a pending group that can combine with a proton; like monomers with a tertiary amine group;
- at least one anionic or acidic monomer (M2), including compounds with a pending group that can yield a proton; like monomers containing carboxylic acid groups;
- at least one neutral or non-ionic monomer (M3); preferably a non-water soluble or hydrophobic comonomer; and
- optionally at least one cross-linking monomer (M4).

The ionic comonomers M1 and M2 will increase solubility and dispersability of the copolymer in an aqueous system; whereas presence of non-ionic monomer units M3 will reduce solubility. Too high an amount of M3 may result in insolubility and/or precipitation of the copolymer. The type and amount of M3 is thus preferably chosen such that the polymer can still be dispersed in an aqueous medium into colloidal particles, M3 units promoting self-association by non-polar or hydrophobic interaction. Optionally, the copolymer may comprise a small amount of di- or polyfunctional monomer M4, which will induce a level of cross-linking that may further stabilize the colloidal particles formed. Typically such random copolymers can already form suitable aggregates in an aqueous medium; thus omitting the need to use more complex synthetic routes of making block copolymers.

In a preferred embodiment, the polyampholyte used in the composition according to the invention is such a copolymer obtained from
- 0.1-40 mole % of at least one monomer M1;
- 0.1-40 mole % of at least one monomer M2;
- 18-98.8 mole % of at least one monomer M3; and
- 0-2 mole % of at least one monomer M4 (with the sum of M1, M2, M3 and M4 adding up to 100%).

A molar excess of M1 over M2 results in a cationic polyampholyte, an excess of M2 over M1 in an anionic polyampholyte, also depending on conditions like pH. Preferably, the polyampholyte used in the composition according to the invention is a cationic copolymer, more specifically such a cationic copolymer obtained from
- 5-40 mole % of at least one monomer M1;
- 0.5-20 mole % of at least one monomer M2;
- 38-94.5 mole % of at least one monomer M3; and
- 0-2 mole % of at least one monomer M4;

the polyampholyte comprising more M1 than M2 monomer units and having a net positive charge.

In further preferred embodiments, the polyampholyte in the composition according to the invention is such a cationic copolymer obtained from at least 6, 7, 8, 9 or 10 mole %, and at most 35, 30, 25, 20 or 16 mole % of at least one monomer M1; from at least 0.6, 0.7, 0.8, 0.9 or 1 mole %, and at most 15, 10, 8, 6, 5 or 4 mole % of at least one monomer M2; and at least one monomer M3 in such amount that the sum of M1, M2, and M3 is 100 mole %.

In embodiments of the invention wherein an anionic polyampholyte is used, preferred ranges for M1 and M2 are similar to M2 and M1, respectively, as mentioned for a cationic polyampholyte.

Cationic monomers M1 that can be suitably used in forming the polyampholyte in the composition according to the invention via addition polymerisation include vinyl monomers with a pending amino functional group; which can be non-ionic monomers that can be neutralised during or after forming the copolymer, monomers with an already neutralised amino functional group, or vinyl monomers with a permanent quaternary ammonium group.

Examples of vinyl monomers bearing non-ionic amino functional groups include N,N-dimethylaminoethyl (meth) acrylate, N,N-dimethylaminohexyl (meth)acrylate, N,N-diethylaminoethyl (meth)acrylate, N-methyl-N-butyl-aminoethyl (meth)acrylate, tert-butylaminoethyl (meth)acrylate, N,N-dimethylaminopropyl (meth)acrylate, 2-(1,1,3,3,-tetramethylbutylamino)ethyl (meth)acrylate, beta-morpholinoethyl (meth)acrylate, 4-(beta-acryloxyethyl) pyridine, vinylbenzylamines, vinylphenylamines, 2-vinylpyridines or 4-vinylpyridines, p-aminostyrenes, dialkyaminostyrenes such as N,N,-diaminomethylstyrene, substituted diallylamines, N-vinylpiperidines, N-vinylimidazole, N-vinylimidazoline, N-vinylpyrazole, N-vinylindole, N-substituted (meth)acryl amides like 2-(dimethylamino)ethyl (meth) acrylamide, 2-(t-butylamino)ethyl (meth)acrylamide, 3-(dimethylamino)propyl (meth)acrylamide, (meth)acryl amide, N-aminoalkyl (meth)acrylamides, vinyl ethers like 10-aminodecyl vinyl ether, 9-aminooctyl vinyl ether, 6-(diethylamino)hexyl vinyl ether, 5-aminopentyl vinyl ether, 3-aminopropyl vinyl ether, 2-aminoethyl vinyl ether, 2-aminobutyl vinyl ether, 4-aminobutyl vinyl ether, 2-dimethylaminoethyl vinyl ether, N-(3,5,5,-triethylhexyl)aminoethyl vinyl ether, N-cyclohexylaminoethyl vinyl ether, N-tert-butylaminoethyl vinyl ether, N-methylaminoethyl vinyl ether, N-2-ethylhexylaminoethyl vinyl ether, N-t-octylaminoethyl vinyl ether, beta-pyrrolidinoethyl vinyl ether, or (N-beta-hydroxyethyl-N-methyl) aminoethyl vinyl ether. Cyclic ureido or thiourea containing ethylenically unsaturated monomers like (meth)acryloxyethyl ethyleneurea, (meth)acryloxyethyl ethylenethiourea (meth)acrylamide ethyleneurea, (meth)acrylamide ethylenethiourea and alike can also be used. Preferred monomers are amino-functional (meth)acrylates and (meth)acrylamides; especially N,N,-dialkylaminoalkyl (meth)acrylates, more specifically t-butylaminoethyl methacrylate, dimethylaminopropyl methacrylate, dimethylaminoethyl methacrylate (DMAEMA) or diethylaminoethyl methacrylate (DEAEMA), more preferably DMAEMA and DEAEMA.

The above given examples of suitable and preferred non-ionic M1 monomers can also be used in their ionised form, by treating with for example an acid, preferably an organic acid like a carboxylic acid, prior to polymerisation.

Suitable examples of M1 monomers with a permanent quaternary ammonium group include methacrylamidopropyl trimethylammonium chloride (MAPTAC), diallyl dimethyl ammonium chloride (DADMAC), 2-trimethyl ammonium ethyl methacrylic chloride (TMAEMC) and quaternary ammonium salts of substituted (meth)acrylic and (meth)acrylamido monomers.

Anionic or acidic monomers M2 that can be suitably used in forming the polyampholyte in the composition according to the invention via addition polymerisation include vinyl monomers with a pending phosphoric, sulfonic, or carboxylic acid group. Preferably vinyl monomers with a carboxylic acid group are used, examples including ethylenically unsaturated monocarboxylic and/or dicarboxylic acids, like fumaric acid, itaconic acid, maleic acid, and especially (meth)acrylic monomers with a carboxylic acid group, such as acrylic acid (AA), methacrylic acid (MAA) and β-carboxy ethylacrylate. Preferred M2 monomers are acrylic acid and methacrylic acid.

Neutral or non-ionic monomers M3 that can be suitably used in the addition polymerised polyampholyte in the composition of the invention include a wide range of ethylenically unsaturated monomers or vinyl monomers, including various styrenic, (meth)acrylic, olefinic, and/or vinylic comonomers. The at least one monomer M3 may be hydrophilic or hydrophobic, or a mixture of both. Preferably, the ampholytic copolymer comprises a certain amount of non-water soluble or hydrophobic comonomers, which will promote the copolymer, not being fully water soluble, to self-assemble in to colloidal particles or aggregates in an aqueous medium. The skilled person will be able to select suitable combinations of monomers and their contents based on the information disclosed in this description and experiments, possibly assisted by some further experiments; and depending on copolymer composition (like M1 and M2 types and amounts) and conditions (like solvent composition, temperature, pH).

Suitable styrene monomers M3 include styrene, alpha-methyl styrene and other substituted styrenes. Suitable (meth)acrylic monomers M3 include alkyl or cycloalkyl (meth)acrylates, preferably $C_1$-$C_{18}$ alkyl (meth)acrylates or $C_1$-$C_8$ alkyl (meth)acrylates, like methyl (meth)acrylate, ethyl (meth)acrylate, butyl (meth)acrylate (all isomers), isobutyl (meth)acrylate, 2-ethylhexyl (meth)acrylate, isopropyl (meth)acrylate, propyl (meth)acrylate (all isomers). Most preferred (meth)acrylic monomers include methyl methacrylate (MMA), ethyl methacrylate (EMA), n-butyl methacrylate (BMA). Similarly, N-alkyl (meth)acrylamides can be used as monomer M3. Also other monomers that can be copolymerized with M1 and M2 can be used as monomer M3, including acrylonitrile, methacrylonitrile, butadiene; vinyl monomers like vinyl chloride, vinyl pyrrolidone, vinyl esters such as vinyl acetate, vinyl propionate, vinyl laurate, vinyl alkyl ethers, and the like.

Suitable examples of di- or polyfunctional monomer M4 include allyl methacrylate, divinyl benzene, ethyleneglycol di(meth)acrylate, butanediol di(meth)acrylate, trimethylolethane tri(meth)acrylate and trimethylolpropane tri(meth)acrylate. Preferably a difunctional monomer is used, preferably in amount of 0-1 mole % based on the polyampholyte.

In a preferred embodiment of the coating composition according to the invention, the polyampholyte is a cationic copolymer obtained from
  8-20 mole % of at least one monomer M1 selected from the group consisting of amino-functional (meth)acrylates and (meth)acrylamides;
  1-4 mole % of at least one monomer M2 selected from the group of (meth)acrylic monomers with a carboxylic acid group; and
  76-91 mole % of at least one monomer M3 selected from the group of C1-C18 alkyl (meth)acrylates.

The molar mass of the polyampholyte In the composition according to the invention can vary widely. Typically, the polyampholyte is a copolymer having a weight averaged molar mass (Mw) in the range 1-500 kDa (kg/mol), preferably Mw is at least 2, 5, 10, 15 or 20 kDa, but at most about 250, 200, 150, 100, 50 or 35 kDa, for optimum formation of colloidal aggregates. The molar mass of the copolymer can be determined by gel permeation chromatography (GPC) using polymethylmethacrylates of known molar masses as a standard and hexafluoro iso-propanol as a solvent.

The polyampholyte is typically present in the coating composition according to the invention in the form of dispersed colloidal particles or aggregates. As it has been found that the size of such colloidal particles has effect on, or even may be reflected in the pore size in the cured porous inorganic coating made from the composition, the average particle size of the colloidal particles, as measured with Dynamic Light Scattering (DLS) on an aqueous dispersion, is preferably is in the range of 10-300 nm, more preferably the average size of the colloidal particles is at least about 15, 20, 25 or 30 nm, and at most about 250, 200, 150, 100 or 75 nm. Particle size of dispersed colloidal polyampholyte particles is found to be not only dependent on molecular composition of the polyampholyte, but may also be controlled by the dispersion conditions, like solvent composition, pH, temperature, salt concentration, etc. Optionally a surfactant may be present to further stabilise the dispersed particles. The surfactant used may be non-ionic, cationic or anionic, or a combination thereof depending the type of polyampholyte and conditions.

Particle size of colloidal particles as measured by DLS is likely to be somewhat different from pore size in a cured coating. With the DLS technique an indication is obtained of the hydrodynamic volume of the polymer aggregrates, especially of the larger particles. Nevertheless, a correlation between sizes of colloidal particles and pore size was observed from water sensitivity of cured coatings. Coatings made from a composition with certain minimum size of colloidal particles have been found to show reversible water absorption/desorption curves, whereas small particles, of e.g. below 20 nm, may result in a coating that absorbs water which is hardly desorbed under ambient conditions.

The dispersed colloidal polyampholyte particles are not considered to be 'hard' particles consisting of only polyampholyte, but to contain water (and organic solvent) solvated or swollen polyampholyte; that is the colloidal particles comprise polyampholyte and solvent. The colloidal organic particles can be described to substantially consist of at least partly solvated polyampholyte aggregates. It is further likely that ionic groups will be predominantly present in an outer layer, with polymer chains protruding into the aqueous medium, and non-ionic groups more inside the particle. Presence of solvent in the particle is also concluded from the observation that a coating with AR properties can be obtained at relatively low curing temperature, at which conditions removal of polyampholyte from the coating is not likely to occur; but solvent may evaporate.

It is also possible that in the coating composition according to the invention at least part of the inorganic oxide precursor is actually located in an outer surface layer of the polyampholyte particle. Without wishing to be bound to any theory, the inventors think that nanoparticles of partially hydrolysed inorganic oxide precursor may complex with or deposit on polyampholyte particles having opposite charge, the polyampholyte acting as a template. In this way a shell layer comprising inorganic oxide (precursor) on the colloidal particles may be formed, to result in hybrid organic-inorganic colloidal particles or core-shell nano-particles. An advantage of such core-shell particles being present, is that the coating composition shows very good storage stability with regards to particle size and viscosity under ambient conditions, but still can be effectively made and reacted into AR coatings layers.

The relative amounts of binder and pore forming agent in the coating composition according to the invention can vary widely, depending on the desired porosity level in the coating. For high anti-reflective properties the content of polyampholyte can be for example more than 50 mass % based on solids content, preferably more than 60 or 70 mass %; but for better mechanical properties the amount of binder may be more than 50 mass % based on solids content, preferably more than 60 or 70 mass %. The concentration of solids or solids content of the composition is the total of all non-volatile components that theoretically remain after the coating composition has been applied to a substrate and subsequently dried. Also for practical reasons, the amount of inorganic oxide that can be theoretically formed rather than the amount of inorganic oxide precursor added to the composition is used to calculate solids content.

The coating composition according to the invention may in addition to polyampholyte and binder optionally comprise other non-volatile or solid components, preferably no more than 20 or 10 mass % based on solids, more preferably no more than 5 mass %. These components may be added to affect other functionalities of the coating or assist in the processing of the coating composition. Examples of other components include a further organic binder, buffer agents, catalysts, coupling agents, surfactants, anti-foaming agents, chelating agents, slip agents and leveling agents.

In a preferred embodiment, the binder in the coating composition according to the invention substantially consists of at least one inorganic oxide precursor.

The coating composition of the invention typically has a solids content of less than about 20, 15 or 10 mass % of the total composition, and a minimum solids content of about 0.1 mass %, preferably at least 0.2, 0.5 or 1.0 mass %.

It is found that the coating composition according to the invention shows good stability over time; i.e. the liquid can be stored at ambient conditions without significant changes in viscosity or size of dispersed particles.

The invention further relates to a method of making the coating composition according to the invention, comprising the steps of
  a) providing an aqueous dispersion of colloidal particles of the synthetic polyampholyte; and
  b) adding at least one inorganic oxide precursor.

In the method according to the invention the step of providing a colloidal dispersion of the polyampholyte in an aqueous medium can be performed as known to a skilled person, e.g. based on his general knowledge, on descriptions in documents cited above, and optionally supported by some experimentation. Typically, dispersing can be performed under mild conditions with proper stirring. The temperature is not very critical and can be up to 100° C., but is typically ambient, i.e. from about 5 to 40° C. The pH is chosen in acidic or basic range, dependent on the type of polyampholyte: in case of a cationic polyampholyte the pH is preferably in the range 2-6, more preferably 3-5 or 3-4.5, if an anionic polyampholyte is used pH is preferably about 8-12, more preferably 9-11 or 9-10. For example, if a cationic polyampholyte is prepared by solution polymerisation, the resulting solution can be, optionally after partially removing solvent, dispersed into an acidic solution of formic acid in water, typically at ambient conditions (see e.g. EP2178927). The pH of the (aqueous or alcoholic) dispersion is typically measured with a standard pH electrode.

In the method according to the invention such polyampholyte dispersion can have a concentration within wide ranges, for example about 1-45 or 2-40 mass %, preferably about 10-25 mass % (polymer based on dispersion).

Formation of colloidal particles or aggregates, e.g. by self-association of the polyampholyte in the aqueous system, can be monitored by various techniques; for example by DLS. The aqueous medium may comprise organic solvents that are miscible with water, like alcohols, ketones, esters, or ethers; as also described above. The amount of organic solvent used is chosen such that the copolymer is dispersed rather than dissolved. As indicated above, the organic solvent may also be present in the colloidal particles.

If desired, the method according to the invention may comprise adding a surfactant during dispersing, to ease formation of dispersed copolymer aggregates and to further stabilise the dispersion obtained. The surfactant used may be non-ionic, cationic or anionic, or a combination thereof depending the type of polyampholyte and conditions, like pH. In such case the colloidal particles in the method according to the invention may thus comprise (or substantially consist of) synthetic polyampholyte, water, organic solvent, and surfactant.

The average particle size of the colloidal particles or aggregates obtained (and as measured by DLS) is found to be not only dependent on molecular composition of the polyampholyte, but also on the dispersion conditions, like solvent composition, pH, temperature, salt concentration, etc.

It was further found that the particle size of the colloidal aggregates in the dispersion obtained is relatively stable within certain ranges of temperature or pH, but may be adjusted by submitting the dispersion to a larger change in conditions, or by changing both pH and temperature. Although the inventors do not wish to be bound to any theory, they believe the ampholytic character of the copolymer plays a distinct role, e.g. by intra- and/or intermolecular association of pending ionic groups of opposite charge.

With the method of the invention it is thus found possible to flexibly control particle size of colloidal particles not only by polyampholyte characteristics like comonomer composition and molar mass, but also by selecting conditions like temperature, pH, salt concentration, and solvent composition. This enables one to make dispersions of colloidal polyampholyte particles with tunable average particle size in the ranges mentioned above, and to subsequently make coating compositions with a pore forming agent of tunable average particle size, starting from one polyampholyte.

The invention therefore also relates to a method of making the coating composition according to the invention, wherein providing an aqueous dispersion of colloidal particles of the synthetic polyampholyte comprises dispersing the synthetic polyampholyte in an aqueous medium, and adjusting particle size by changing both pH and temperature. For example, in case of an aqueous colloidal dispersion of a cationic polyampholyte containing about 14 mole % of DMAEMA, 3.5 mole % MAA and 82.5 mole % MMA initial particle size after dispersing at pH 4.5 was about 140 nm, and remained fairly constant upon lowering pH from about 4.5 to 2.5, or increasing temperature from ambient to about 90° C. Bringing the pH to below about 4 and heating to above about 60° C., however, resulted in particles of about 20 nm. Also the dispersion of these particles was found to be stable; only by increasing the pH to near the isoelectric point of the polyampholyte the size of these particles increased again, and resulted in gel formation. With the method of the invention it is thus possible to make colloidal dispersions of polyampholyte particles, and to adjust average particle size by varying composition of the starting polyampholyte and/or by varying conditions of the dispersion.

The method of the invention may further comprise a step of adding an organic compound to the dispersion obtained, such that the organic compound is contained mainly in the dispersed polyampholyte particles. Typically, this compound will have limited water solubility, such that is preferentially taken up by the colloidal particles; which can also be considered an oil-in-water dispersion. Examples of organic compounds include organic solvents, which later on can be evaporated from the particles and coating composition, to result in enhanced porosity of the inorganic oxide coating, or enhanced porosity formation at relatively low temperature, depending on its volatility. Preferably, the organic compound has a boiling point of at most 250° C., or at most 200, 175 or 150° C. The pore forming agent in such case could be considered to comprise synthetic polyampholyte and an organic compound.

The method according to the invention comprises a step b) of adding at least one inorganic oxide precursor to the polyampholyte dispersion. Suitable and preferred inorganic oxide precursors including metal salts and chelates, and organo-metallic compounds, as well as their amounts relative to polyampholyte in such method are similar to those described above for the coating composition, including all preferred embodiments and combinations. The at least one inorganic oxide precursor may be added in one or more steps, under same or different conditions.

As described above for the dispersing step, adding inorganic oxide precursor is typically performed under mild conditions and in aqueous medium. As mentioned above, the aqueous medium may comprise an organic solvent that is miscible with water, like alcohols, ketones, esters, or ethers; preferably an alcohol like methanol, ethanol or iso-propanol. Generally, the inorganic oxide precursor is partially hydrolysed upon addition by reaction with water, to form a sol of nanoparticles, typically having a diameter in the range 1-20 nm. The temperature is not very critical and can be varied widely as long as the polyampholyte dispersion is not disrupted. Typically temperature is ambient, i.e. from about 15 to 40° C. As said hydrolysis reaction is exothermic, cooling may be used to control temperature. The pH is chosen in acidic or basic range, dependent on the type of polyampholyte: in case of a cationic polyampholyte the pH preferably is in the range 2-6, more preferably 3-5 or 3-4.5, if an anionic polyampholyte is used pH is preferably about 8-12, more preferably 9-11 or 9-10. An advantage of applying such conditions is that nanoparticles formed from the precursor and typically having a charge, may at least partly deposit on the colloidal polyampholyte particles of opposite charge. This way an open or 'fluffy', or even more condensed layer of inorganic oxide (precursor) may form around the polyampholyte particles. Such shell forming process will likely stop when the particle has no net charge anymore. The hybrid organic-inorganic particles obtained in situ are also called core-shell particles.

These above described steps of the process according to the invention are typically performed at ambient pressure, but increased (or reduced) pressure may also be applied.

In the method according to the invention possible changes in particle size of the dispersed polyampholyte upon inorganic oxide precursor addition may be monitored, e.g. by DLS. Although the DLS technique has its draw-backs, for example mainly detecting the larger particles, it is a simple and convenient method. Increase in particle size may be induced for example by absorption of compounds, e.g. alcohol, liberated by hydrolysis of precursor, and/or by inorganic oxide shell formation on the particles. If a shell is formed, this typically is of limited thickness; for example in the range of 1-20 nm, preferably 1-10 nm. Shell thickness of core-shell nano-particles formed, and their morphology can also be assessed with techniques like TEM, especially cryo-TEM, SAXS, SANS, or AFM.

The coating composition thus obtained comprises dispersed particles, optionally of core-shell structure, having average particle size in similar ranges as those indicated above for the polyampholyte dispersion.

The composition obtained with the method according to the invention can be stabilised by diluting the dispersion to below e.g. 5 or 3 mass %, preferably with solvents as mentioned above, and/or by changing pH. Storing at low temperatures, preferably below room temperature, more preferably below 15 or 10° C. but above the freezing point, may also increase shelf-life of the coating composition.

In a preferred embodiment, the method according to the invention further comprises a step c) of stabilising the dispersion obtained by changing the pH to a level at which the inorganic oxide precursor and its reaction products will not react, including only very slow reaction, to prevent agglomeration of dispersed particles and gelling of the composition. For example, in case the method applies a silica precursor the pH is preferably adjusted to about 2-3 (as measured with a pH electrode).

The product directly obtained with the method according to the invention is a dispersion comprising polyampholyte and inorganic oxide precursor, which may have been partly hydrolysed. This dispersion is found to show remarkably good storage and handling stability, meaning the dispersion shows little tendency to changing viscosity or gelling compared to other sol-gel process based dispersions. The dispersion can also be diluted to lower solids content of the composition by adding a further solvent, preferably an alcohol.

It was further found that the stabilised dispersion may be even exposed to elevated temperatures; allowing at least part of the solvent, including water, to be removed by evaporation with or without pressure reduction, and thus to increase the solids content of the dispersion. Surprisingly, also this concentrated dispersion showed good stability during further handling. This greatly increases the possibilities for using the dispersion obtained in a number of applications. It is for example possible to dilute the composition again—e.g. shortly before use to form a coating—to a desired viscosity level, by adding solvent. It is also possible to add a solution or dispersion of a further binder, like an organic binder or an inorganic oxide precursor. Preferably such further binder is an inorganic oxide precursor, which further precursor may be the same, similar to or different from the inorganic oxide precursor already added to the coating composition in step b) of the method of the invention. The method according to the invention therefore preferably contains a further step d) of adjusting the solids content of the composition, by partly removing solvent, by adding a further solvent, by adding a further binder, or by a combination thereof.

The coating composition according to the invention can be used for making a coating on a substrate, especially a porous inorganic oxide coating on a substrate. Porosity of the coating will depend on the relative amount of pore forming organic component in the composition, and on the amount thereof that is removed during forming the coating. Also the thickness of the coating layer applied can be varied, depending on o.a. solids content and wet layer thickness; meaning that coatings with different properties for different uses can be made from the composition, including hard coats, low friction coatings, and AR coatings.

In a further aspect the invention thus relates to a process for making a porous inorganic oxide coating on a substrate comprising the steps of applying the coating composition according to the invention or obtained with the method according to the invention to the substrate; and drying and curing the applied coating layer.

In a preferred embodiment the invention relates to a process for making an anti-reflective (AR) coated transparent substrate comprising the steps of
- applying the coating composition according to the invention or obtained with the method according to the invention to the substrate; and
- drying and curing the applied coating layer.

The transparent substrate on which the coating composition according to the invention can be applied can vary widely, and can be organic or inorganic and of various geometries. Preferably, the substrate is transparent for at least visible light. Suitable substrates include inorganic glasses (e.g. borosilicate glass, soda lime glass, glass ceramic, aluminosilicate glass) and plastics (e.g. PET, PC, TAC, PMMA, PE, PP, PVC and PS) or composite materials like laminates. Preferably the substrate is a glass, like borosilicate glass; preferably a flat glass like float glass with smooth or patterned surface.

The coating composition of the invention can be applied directly to the substrate, but also to another coating layer already present on the substrate; like a barrier layer for alkali ions, or an adhesion promoting layer.

The process according to the invention may also apply more than one coating layer, with intermediate drying performed after the application of each layer. In some embodiments, intermediate drying and curing is performed after applying some or all of the layers.

In the process according to the invention the coating composition can be applied to the substrate with various deposition techniques, as known to a skilled person for making thin homogeneous coating layers. Suitable methods include spin-coating, dip-coating, spray-coating, roll-coating, slot die-coating, and the like. Preferred methods are dip-coating, roll-coating and slot die-coating. The thickness of the wet coating layer to be applied depends on the amount of solid film forming components in the coating composition, and on the desired layer thickness after subsequent drying and curing. The skilled person will be able to select appropriate methods and conditions depending on the situation.

The coating composition is preferably applied to the substrate for making a (single layer) AR coating in such wet thickness that will result in a thickness after drying and/or curing of about 20 nm or more, preferably the applied cured coating has a layer thickness of at least about 50 or 70 nm and of at most about 200, 180, 160 or 140 nm. In case of a multi-layer coating the skilled person may select different layer thicknesses.

In the process according to the invention the steps of drying and curing the applied coating composition will comprise drying to evaporate at least part of the solvent(s) and other volatile components, and then curing to complete reaction of the binder into for example inorganic oxide(s), and optionally removing residual and non-volatile organic components like the polyampholyte.

Drying preferably takes place under ambient conditions (e.g. 15-30° C.), although elevated temperatures (e.g. up to about 250° C., more preferably up to 100, 50 or 40° C.) may also be used to shorten the total drying time. Drying may be promoted by applying an inert gas flow, or reducing pressure. Specific drying conditions may be determined by a person skilled in the art based on solvent or diluent to be evaporated.

During drying also solvent contained in the dispersed polyampholyte particles may at least partly be removed; resulting in porous or hollow particles, which may still comprise polyampholyte. Such process can thus also result in a certain porosity and AR properties of the coating, even without fully removing all organics including the polyampholyte. An advantage hereof is that an AR coating can be made at relatively low temperature, allowing use of substrates with limited thermal resistance, like plastic substrates. In such way of performing the process of the invention, also the curing step can be performed at a temperature compatible with the substrate. After curing a substrate coated with a hybrid organic-inorganic coating and showing AR properties is thus obtained.

After drying, i.e. after substantially removing volatile components, the applied layer is preferably cured. Curing may be performed using a number of techniques including thermal curing, flash heating, UV curing, electron beam curing, laser induced curing, gamma radiation curing, plasma curing, microwave curing and combinations thereof. Curing conditions are depending on the coating composition and curing mechanism of the binder, and on the type of substrate. The skilled person is able to select proper techniques and conditions. Thermally curing coatings at e.g. temperatures above 250° C. is preferred for inorganic oxide precursors as binder. Such conditions are often not possible for a plastic substrate. In such case flash heating may advantageously be applied to minimise exposure of the substrate to high temperature; as is for example described in WO2012037234.

After curing the coating, residual organics including polymeric pore forming agent can be optionally (further) removed by known methods; for example by exposing the coating to a solvent and extracting the organic compound from the coating. Alternatively, an organic compound or polymer can be removed by heating at temperatures above the decomposition temperature of the organic polymer, i.e. polyampholyte. Suitable temperatures are from about 250 to 900° C., preferably above 300, 400, 450, 500, 550 or 600° C., during at least several minutes. Such heating will also promote formation of oxides from inorganic oxide precursors, especially when in the presence of oxygen; resulting in both curing and removing organics by calcination. A combined treatment of dissolving and degrading/evaporating the compound or polymer may also be applied.

In a preferred embodiment, organics are removed by heating combined with thermally curing the coating. For example, in case of an inorganic glass substrate curing can be performed at relatively high temperatures; of up to the softening temperature of the glass. Such curing by heating is preferably performed in the presence of air, and is often referred to as firing in e.g. glass industry. If desired, the air may comprise increased amounts of water (steam) to further enhance curing and formation of an inorganic oxide coating. The product obtained by such process is typically a fully inorganic porous coating.

In a further preferred embodiment, such curing step is combined with a glass tempering step; i.e. heating the coated glass substrate to about 600-700° C. during a few minutes, followed by quenching, to result in AR-coated toughened or safety glass.

The invention further relates to an AR coated transparent substrate that is obtainable by (or is obtained with) the process according to the invention and as described herein above, including all combinations and perturbations of indicated features and embodiments.

An anti-reflective (AR) or light reflection reducing coating is a coating that reduces the reflection of light from the surface of a substrate at one or more wavelengths between 425 and 675 nm, as measured at 5° incident angle. Measurements are carried out on the coated and uncoated substrate. Preferably the reduction in reflection is about 30% or more, preferably about 50% or more, more preferably about 70% or more, even more preferably about 85% or more. The reduction in reflection as expressed in a percentage is equal to 100×(reflection of the uncoated substrate−the reflection of the coated substrate)/(reflection of uncoated substrate).

Typically, the AR coated substrate obtainable by the process according to the invention shows good AR properties, in combination with good mechanical performance, like a surface hardness of at least 3H, more preferably at least 4H or 5H, as measured by the pencil hardness test (as defined later). The AR coated substrate according to the invention shows at a coated side a minimum reflection of 2% or less at a certain wavelength, preferably about 1% or less, and more preferably of at most about 1.4, 1.2, 1.0, 0.8 or 0.6% (for two-sided coated substrate). The average reflection over a 425-675 nm wavelength range for a two-sided coated substrate is preferably about 3% or less, and more preferably at most about 2, 1.8, 1.7, 1.6 or 1.5%.

The AR coated substrate according to the invention may be used in many different applications and end-uses, like window glazing, cover glass for solar modules, including thermal and photo-voltaic solar systems, or cover glass for TV screens and displays. The invention thus further relates to an article comprising the AR coated substrate obtained with the process according to the invention. Examples of such articles include solar panels, like a thermal solar panel or a photo-voltaic module, monitors, touch-screen displays for mobile phones, tablet pc's or all-in-one pc's, and TV sets.

As used herein, the term "by mass of the solid fraction" or "mass % based on solids" refers to the calculated mass percentage after removal of all volatiles like solvent including water, and based on inorganic oxide. Throughout the description and claims of this specification, the words "comprise" and "contain" and variations of the words, for example "comprising" and "comprises", means "including but not limited to", and is not intended to (and does not) exclude other moieties, additives, components, integers or steps.

Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups, process conditions etc. as described in conjunction with a particular or preferred aspect, embodiment or example of the invention are to be understood to be applicable to any other aspect, embodiment or example described herein unless stated otherwise or obviously incompatible therewith.

The invention will be further illustrated by the following examples and comparative experiments, without being limited thereto.

EXPERIMENTS

Materials and methods
Polyampholyte Dispersions

Table 1 presents some characteristics of a number of copolymers in the form of aqueous dispersions, as obtained following the procedure described in the experimental part of EP2178927. These dispersions had a concentration of about 20 mass % of copolymer in water and pH of about 4 (acidified with formic acid), and had undergone heating at about 80° C. during about 30 minutes. PA1-PA4 represent ampholytic terpolymers, PE1 is a cationic copolymer for comparison. The copolymers had a Mw in the range 25-40 kDa.

It is noted that the polyampholytes PA1-PA4 resulted in apparent colloidal aggregates; the polyelectrolyte PE1 appeared to be dissolved, as no distinct particles were detected with DLS.

DLS Measurements

A Malvern Nano ZS was used to measure particle size of dispersed particles on 1 drop of dispersion in 10 ml aqueous KCl solution (1 mmol/L) at 25° C. and in back-scattering mode. This apparatus was also used for measuring zeta potential on a diluted sample (with M3 PALS and MPT-2 units).

TABLE 1

|  | PA1 | PA2 | PA3 | PA4 | PE1 |
|---|---|---|---|---|---|
| Monomer composition | | | | | |
| DMAEMA (mol %) | 5.3 | 6.4 | 8.1 | 14.0 | 10.9 |
| MAA (mol %) | 1.3 | 1.6 | 2.0 | 3.5 | 0 |
| MMA (mol %) | 93.4 | 92.0 | 89.9 | 82.5 | 89.1 |
| Copolymer dispersion | | | | | |
| z-average particle size (nm) | 151 | 41 | 25 | 13 | Not detected |
| PDI | 0.05 | 0.3 | 0.1 | 0.4 | |

Pencil Hardness

Hardness of coatings was evaluated with a Gardco 3363 pencil hardness tester on a single-sided coated substrate using a nominal load to the substrate of 300 g, at least 1 day after preparing and curing the coating. The ASTM D3363 test method was followed, ignoring the initial 1 cm for judging damage to the surface.

Optical Properties

Reflection and transmission of coated transparent substrates were evaluated with a Shimadzu UV-2450 spectrophotometer. Relative specular reflectance was measured at an incident angle of 5° with a reflectance attachment. For measuring transmission the integrating sphere attachment was installed in the sample compartment, and incidence angle was 0°. Average reflection values are calculated for the wavelength range 425-675 nm. Measurements are performed on two-sided coated substrate unless indicated otherwise.

EXAMPLE 1

Aqueous dispersion of PA3 was acidified to about pH 2.5 with 10% HCl, heated to above 60° C., cooled to room temperature, and then diluted and placed in the DLS device; allowing to measure particle size, pH and zeta-potential simultaneously. The pH of the dispersion was gradually increased by addition of aliquots of aqueous ammonia. Particle size was found to remain about 25 nm until about pH 6.5, after which particle size quickly increased. The zeta-potential dropped from about 35 to −5 mV in this range, indicating that net charge changed from positive to negative.

In other experiments pH of more concentrated dispersions was gradually increased at room temperature, which resulted in gel formation at about pH 6.5.

EXAMPLE 2

Example 1 was repeated without the dilution step needed for DLS, and the dispersion was heated to about 90° C. after each addition of aqueous ammonia. Particle size and pH were measured before and after heating. Results presented in FIG. 1 show that average particle size of this polyampholyte colloidal dispersion can be adjusted by changing both pH and temperature in the range 20-50 nm. Note that the sample brought to pH 6.5 gelled upon heating.

EXAMPLE 3

Figure 2:
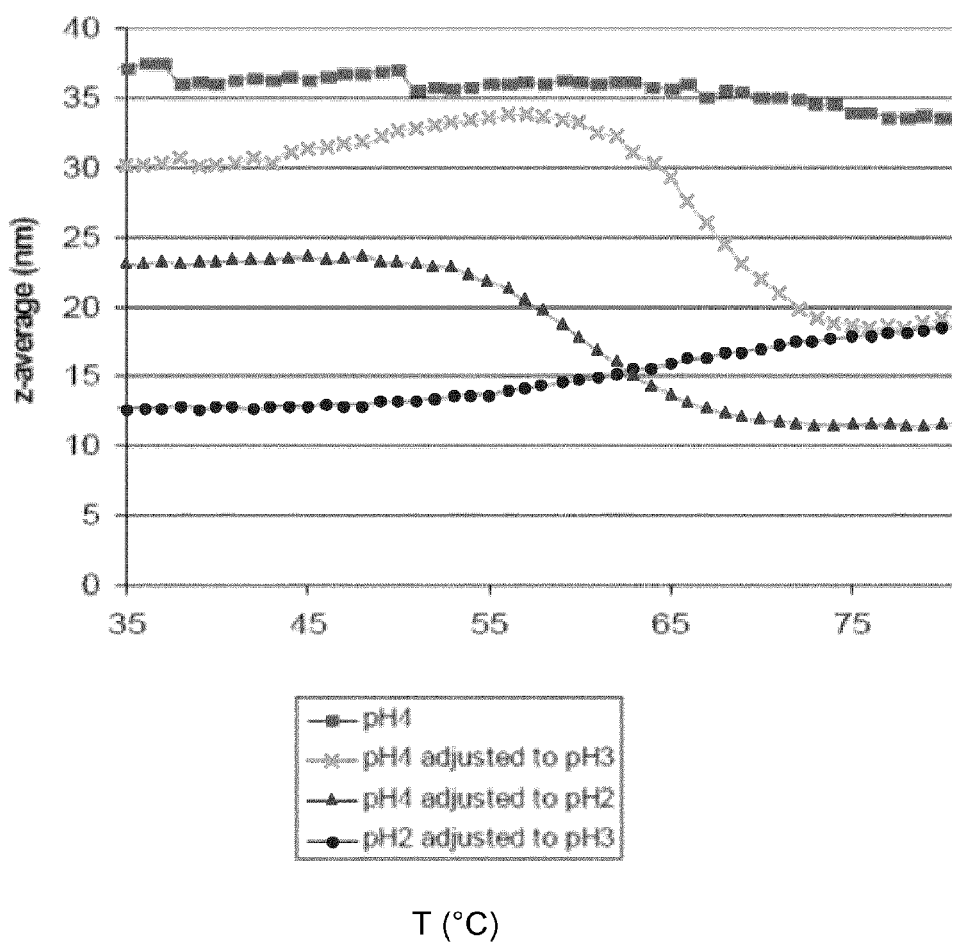
FIG. 2 is a graph of z-average (nm) versus temperature (° C.) for the dispersion according to Example 3 below.

A sample of PA3 dispersion with pH 4 was diluted and placed in the DLS device; and particle size was measured as function of temperature. The graph shown in FIG. 2 indicates that the dispersion is stable up to about at least 80° C. The experiment was repeated after adjusting pH to about 3, in which case particle size decreased when temperature raised to above about 60° C. Similarly, particle size decreased upon heating after adjusting pH to about 2.

If this sample was subsequently cooled and pH adjusted to 3, followed by reheating, particle size increased again.

These experiments again show that particle size of the polyampholyte colloidal dispersion can be adjusted by changing both pH and temperature.

EXAMPLE 4

In these experiments different amounts of silica precursor were added to PA3 dispersion, and the colloidal dispersion obtained was then used to make coating compositions, and subsequently to make coated glass substrates.

425 g of PA3 dispersion (about 20% solids in water of pH 4) was diluted with 3835 g of water in a conical 5 L flask equipped with an 8 cm magnetic stirring bar. After dilution the DLS z-average particle size was 25.6 nm, zeta-potential +25 mV, and pH 4.1. 300 g TMOS was then added in about 5 min. under stirring at temperature within 21-25° C. After 24 h stirring, particle size was measured to be 28.5 nm, zeta-potential +12 mV, and pH 3.8. From these changes formation of a Si-containing shell on the polyampholyte particles resulting in core-shell particles can be concluded. The calculated mass ratio of $SiO_2$ (resulting from TMOS) to polyampholyte is 1.39.

A sol of TEOS in ethanol/water was prepared by adding 339 g TEOS to 922 g ethanol in a conical 5 L flask with an 8 cm stirring bar. Subsequently 310 g water and then 34.6 g of glacial acetic acid were added, and stirred during 24 hr at ambient conditions. Then 965 g ethanol was added and 7.2 g of nitric acid (65%).

To the PA3/TMOS dispersion 1124 g of the TEOS sol was added as binder, after which the pH was adjusted to about 2 by adding nitric acid (65%), followed by adding 5600 g of ethanol; and refluxing during 1 hr. The calculated mass ratio of $SiO_2$ (resulting from TMOS and TEOS) to polyampholyte to is 1.89 for this coating composition.

The obtained coating composition was used to provide coating layers to glass plates by a dip-coating process. A float glass plate of 50×50 cm and 2 mm thickness was dip-coated by immersing in a container containing this composition. The coating bath was kept at ambient conditions, i.e. at about 21° C. and 50% relative humidity. The plate was then vertically pulled up from the bath at a rate of about 6.0 mm/s. The coated plate was subsequently dried at ambient conditions for about 5 minutes, and then cured at 450° C. in an air circulation oven during 3 hours.

The thus obtained coated glass appeared completely clear to the eye, and showed no visual defects. Reflection properties of coated glass plates were measured; results are summarized in Table 2.

The hardness of the cured coating was measured on a single-side dip-coated glass plate as pencil hardness 5H.

Both the intermediate PA/TMOS dispersion and the coating composition were found to be stable. The coating composition appeared virtually clear to the eye, and did not visually change upon storage during at least 7 months under ambient conditions. Repeating the coating experiments during said storage period resulted in similar coating performance. Also after almost 18 months of storage the composition was haze free, and could be made into a coating with similar properties.

TABLE 2

| Sample | "$SiO_2$"/polyampholyte (m/m) | Minimum reflection (%) | Wavelength of minimum reflection (nm) | Average reflection (%) |
|---|---|---|---|---|
| Example 4 | 1.89 | 0.9 | 545 | 1.4 |
| Example 5 | 1.5 | 0.3 | 543 | 0.8 |
| Example 6 | 1.75 | 0.5 | 546 | 1.0 |
| Example 7 | 2.0 | 0.9 | 581 | 1.5 |
| Example 8 | 2.25 | 1.2 | 581 | 1.8 |
| Example 9 | 2.5 | 1.4 | 579 | 2.0 |

EXAMPLES 5-9

Example 4 was repeated, but a different amount of TMOS was used and the amount of TEOS sol added was varied from no addition (Ex 5) to such amount resulting in a calculated $SiO_2$ to polyampholyte ratio of 2.5. Compositional data and measured reflection properties are summarized in Table 2. It can be concluded that increasing the amount of TEOS results in somewhat more reflection (or reduces somewhat the AR properties). This can be explained by TEOS acting as binder for dispersed particles resulting in lower porosity, which expectedly increases mechanical properties.

EXAMPLE 10

Analogous to Example 4 a colloidal PA3/TMOS dispersion was made, and then acidified to pH 2.5 with nitric acid, and heated to about 80° C. under reduced pressure, during which evaporation of water was observed. The initial solids content of this dispersion of about 4 mass % was now measured to be about 13.5 mass % (and was still clear).

To make a coating composition, this dispersion was again diluted with ethanol to about 3 mass % solids, and then TEOS sol (as made above) was added to result in a "$SiO_2$"/polyampholyte ratio of 1.6. A dip-coated glass plate showed good optical properties without defects and minimum reflection of 0.4% at 628 nm.

EXAMPLE 11

A polyampholyte containing MMA, DMAEMA and MAA monomeric units was prepared by emulsion polymerisation of MMA and DMAEMA (85:15 mol ratio) at 85° C. during 60 min. in the presence of ammonium persulphate as initiator, iso-octyl thioglycolate as chain transfer agent, and a phosphate-based anionic surfactant (Rhodafac RS-710). To improve stability of the dispersion so obtained a non-ionic surfactant was added. After cooling to room temperature, formic acid solution was added during 30 min to result in pH of 4. The resulting polyampholyte dispersion had a solids content of 20 mass %, particle size was about 78 nm (z-average particle size; PDI 0.1), and Mw 40 kDa (GPC).

As it is known that DMAEMA may hydrolyse to form acid groups (MAA), the charge density of the dispersion was measured using a Mütek PCD 03 pH. particle charge detector. About 100 mg sample was diluted with water to 30 ml, and 1000 µl 0.1 M acetic acid buffered at pH 4 was added. The sample was titrated until zero charge potential (in mV) with 0.001 N solution of sodium poly-ethylenesulfonate (NaPES). The measured charge density was about 20% lower than the calculated charge density for a MMA/DMAEMA 85/15 copolymer. Apparently about 20% of DMAEMA had hydrolysed into MAA units; which was confirmed by isoelectric point determination.

Figure 3:
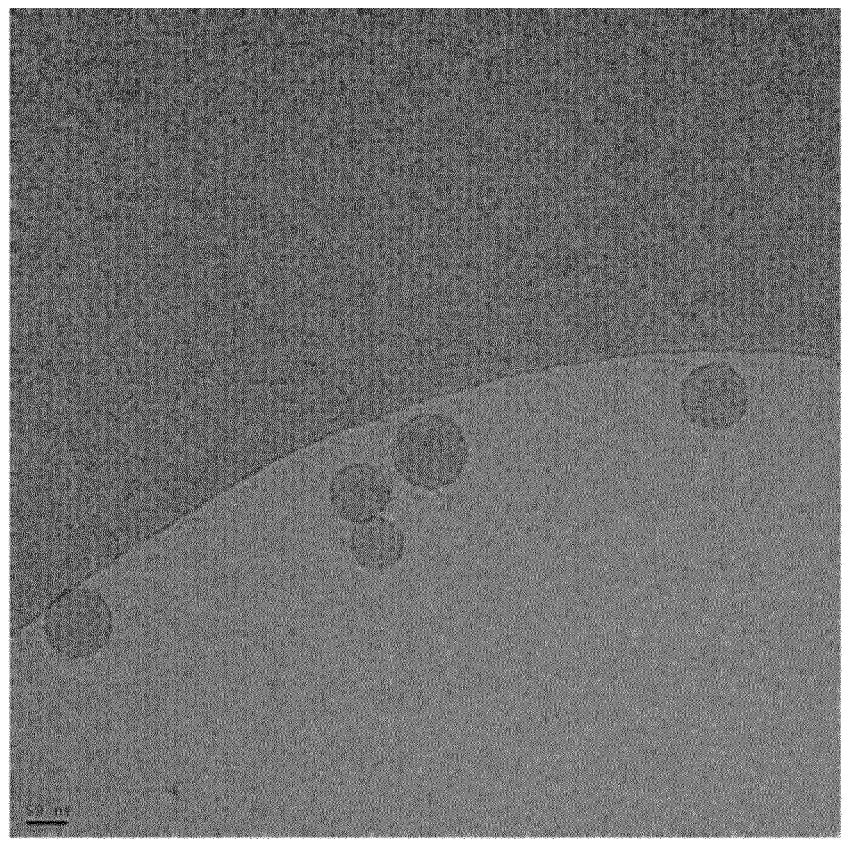
FIG. 3 is a photomicrograph of the coated sample according to Example 11 below.

A coating composition was then prepared by diluting the polyampholyte dispersion with water to a solids content of 10 mass %, followed by adding TMOS under stirring at about 15° C.; at a mass ratio of TMOS/dispersed polyampholyte of 5. After 16 hr DLS measurements indicated a particle size of 120 nm; then the formulation was acidified with diluted nitric acid to pH 1.5, followed by diluting with isopropanol to result in a composition with about 2 mass % theoretical $SiO_2$ content. The obtained composition was colourless and haze-free, and was stored during several months at room temperature (or several weeks at 40° C.). Weekly visual inspection and DLS measurements did not reveal measurable changes. A sample from the composition was examined with cryo-TEM; the micrograph shown in FIG. 3 shows spherical particles with core-shell structure and of diameter of about 60-90 nm.

Analogously to Example 4 glass plates were dip-coated and cured at 650° C. during 2.5 min. The resulting coated plates were transparent without haze, and showed no visual defects. Minimum reflection was 0.7% at 575 nm. The optical properties appeared to be insensitive to changes in relative humidity during storage under ambient conditions.

The invention claimed is:

1. A coating composition for making a porous inorganic oxide coating on a substrate, the coating composition comprising an inorganic oxide precursor as a binder, a solvent, and dispersed colloidal particles of an organic synthetic polyampholyte as a pore forming agent, wherein the organic synthetic polyampholyte is a copolymer of at least one comonomer having a positively charged group, at least one comonomer having a negatively charged group and optionally at least one neutral comonomer.

2. The coating composition according to claim 1, wherein the inorganic oxide precursor is at least one compound selected from the group of metal salts, metal chelates and organo-metallic compounds of Si, Al, Ti, Ta, and Zr.

3. The coating composition according to claim 2, wherein the inorganic oxide precursor comprises an alkoxy silane.

4. The coating composition according to claim 1, wherein the polyampholyte is an addition copolymer made from vinyl monomers.

5. The coating composition according to claim 1, wherein the polyampholyte is a copolymer of:
at least one cationic or basic monomer (M1), including compounds with a pending group that can combine with a proton;
at least one anionic or acidic monomer (M2), including compounds with a pending group that can yield a proton;
at least one neutral or non-ionic monomer (M3); and
optionally at least one cross-linking monomer (M4).

6. The coating composition according to claim 5, wherein the polyampholyte is a cationic copolymer of:
5-40 mole % of at least one monomer M1;
0.5-20 mole % of at least one monomer M2;
38-94.5 mole % of at least one monomer M3; and
02mole % of at least one monomer M4.

7. The coating composition according to claim 5, wherein the polyampholyte is a cationic copolymer of:
8-20 mole % of at least one monomer M1 selected from the group consisting of amino-functional (meth)acrylates and (meth)acrylamides;
1-4 mole % of at least one monomer M2 selected from the group of (meth)acrylic monomers with a carboxylic acid group; and
76-91 mole % of at least one monomer M3 selected from the group of C1-C18 alkyl (meth)acrylates.

8. The coating composition according to claim 1, wherein the polyampholyte particles have an average size of 20-200 nm as measured with dynamic light scattering (DLS).

9. The coating composition according to claim 5, wherein the basic monomer (M1) includes monomers with a tertiary amine group.

10. The coating composition according to claim 5, wherein the acidic monomer (M2) includes monomers containing carboxylic acid groups.

11. A method of making the coating composition according to claim 1, comprising the steps of:
a) providing an aqueous dispersion of colloidal particles of the synthetic polyampholyte; and
b) adding at least one inorganic oxide precursor.

12. The method according to claim 11, wherein step a) comprises dispersing the synthetic polyampholyte in an aqueous medium, and adjusting particle size by changing both pH and temperature.

13. The method according to claim 11, further comprising a step c) of stabilising the dispersion obtained by changing the pH to a level at which the inorganic oxide precursor and its reaction products will not react.

14. A process for making an anti-reflective coated transparent substrate comprising the steps of:
(i) applying the coating composition according to claim 1 to a surface of a substrate; and
(ii) drying and curing the applied coating layer to form an anti-reflective coated transparent substrate.

15. The process according to claim 14, wherein the substrate is an inorganic glass, and wherein curing is performed by heating at temperatures above a decomposition temperature of the polyampholyte.

16. An anti-reflective (AR) coated transparent substrate which comprises a transparent substrate, and a dried and cured layer of the coating composition according to claim 1 on the substrate.

17. The AR coated transparent substrate of claim 16, which exhibits a minimum reflection in a wavelength range 425-675 nm of at most 1% and a pencil hardness of at least 4H according to ASTM D3363 with a nominal load 300 g.

* * * * *